United States Patent [19]

Rigby et al.

[11] Patent Number: 5,180,654
[45] Date of Patent: Jan. 19, 1993

US005180654A

[54] PROCESSING RADIATION SENSITIVE MEMBERS WITH AQUEOUS ETHYL HEXYL SULPHATE TREATMENT PRIOR TO BURN-IN STEP

[75] Inventors: Stephen D. Rigby, Near Dewsbury; Paul A. Styan, Leeds, both of Great Britain

[73] Assignee: E. I. Du Pont de Nemours and Company, Wilmington, Del.

[21] Appl. No.: 762,069

[22] Filed: Sep. 18, 1991

Related U.S. Application Data

[63] Continuation of Ser. No. 442,010, Nov. 28, 1989, abandoned.

[30] Foreign Application Priority Data

Nov. 29, 1988 [GB] United Kingdom ............... 8827813

[51] Int. Cl.$^5$ ................................................ G03C 1/52
[52] U.S. Cl. .................................... 430/309; 430/325; 430/326; 430/331

[58] Field of Search ................ 430/309, 331, 325, 326

[56] References Cited

U.S. PATENT DOCUMENTS 4,780,396 10/1988 Hsieh et al. ........................ 430/331
4,885,230 12/1989 Stahlhofen et al. ................ 430/309

FOREIGN PATENT DOCUMENTS 1513368 7/1978 United Kingdom .
1575200 7/1980 United Kingdom .

Primary Examiner—Marion E. McCamish
Assistant Examiner—S. Rosasco
Attorney, Agent, or Firm—Bromberg & Sunstein

[57] ABSTRACT

In a process for treating a radiation sensitive member which includes image-wise exposure to radiation, development and burning-in of the member, after the development and prior to the burning-in, an aqueous solution including ethyl hexyl sulphate is applied to the member.

15 Claims, No Drawings

PROCESSING RADIATION SENSITIVE MEMBERS WITH AQUEOUS ETHYL HEXYL SULPHATE TREATMENT PRIOR TO BURN-IN STEP

This is a continuation of copending application Ser. No. 07/442,010 filed on Nov. 28, 1989, now abandoned.

This invention relates to the processing of radiation sensitive members and more particularly is concerned with the processing of such members to form lithographic printing plates.

As is well known, a lithographic printing plate consists of a hydrophilic substrate having an olephilic image thereon. The printing plate is formed from a radiation sensitive member comprising the substrate coated with a radiation sensitive composition by image-wise exposing the radiation-sensitive coating to alter the solubility characteristics of the exposed areas and then treating the member with a suitable developer to selectively remove the more soluble areas and leave an image constituted by the less soluble areas. This image forms the olephilic printing image of the printing plate and the underlying areas of the substrate which are revealed on development constitute the hydrophilic non-image areas of the printing plate.

It is well known that the printing life of certain types of printing plates can be increased by heating "(burning-in") the plate to harden the image. However, such heating can cause the non-image areas to be coated with contaminating residues which are oleophilic so that these parts of the non-image areas are no longer hydrophilic. These contaminating residues can only be removed from the plate with difficulty. If, however, they are not removed the contaminated parts of the non-image areas pick up ink during printing and produce a condition known as "scumming".

In order to prevent such scumming, it is proposed, in GB Patent Specifications No. 699412 and No. 1154749 to treat the plate, after the heating step, with a further developer to remove the contaminating residues. An alternative solution is described in GB Patent Specification No. 1513368 where there is disclosed and claimed, in a method of treating a plate comprising a substrate carrying an image which method comprises the step of heating the plate, the improvement which comprises providing a water soluble layer on the plate prior to the heating step so as to prevent contaminating residues contacting the plate during the heating step.

Various materials for forming the watersoluble layer are disclosed in GB Specification No. 1513368. Further materials are disclosed in GB Specification No. 1575200, which is a patent of addition to GB Patent No. 1513368.

In practice, by far the most effective material is the sodium salt of dodecyl diphenyl ether disulphonate. This material is commercially available from Dow Chemical Company under the tradename Dowfax. Although many attempts have been made to find an alternative material, none have hitherto been particularly successful. However, the Dowfax material does have certain disadvantages. Thus, it has a tendency to foam which can cause a problem when used in certain types of automatic processors. Also it sometimes causes a blinding effect on the image as a consequence of which the image loses its oleophilic property and becomes reluctant to accept printing ink.

It is an object of this invention to provide an improved method of processing radiation-sensitive members which overcome the above disadvantages.

Surprisingly, it has now been found that a particular material, namely ethyl hexyl sulphate, has the ability to protect the non-image areas in a comparable manner to the sodium salt of dodecyl diphenyl ether disulphonate, but is to some degree repelled by the image. Thus, little ethyl hexyl sulphate is present on the surface of the image when the member is baked and any tendency for the image to become blind is reduced.

Accordingly the present invention provides a method of treating a radiation-sensitive member which comprises image-wise exposure to radiation, development and burning-in treatment, in which method an aqueous solution comprising an ethyl hexyl sulphate is applied to the member after the development but prior to the burning-in treatment.

Preferably the amount of ethyl hexyl sulphate in the aqueous solution is from 5 to 50%, and particularly preferably from 8 to 15% by volume of a 40% (w/v) aqueous solution, or an amount equivalent.

Preferably, the aqueous solution also contains a citrate, e.g. tripotassium citrate in an amount of from 3 to 10%, and particularly preferably from 5 to 8% by weight.

It is further preferred that the pH of the aqueous solution is within the range from pH3 to pH7 and more particularly from pH 4.5 to pH 5.5. Preferably citric acid is used to adjust the pH of the aqueous solution in an amount of from 1 to 3% by weight.

It is also preferable to include in the aqueous solution a surfactant with good wetting properties in order to ensure good coverage of the aqueous solution across the plate surface. Suitable surfactants include dodecyl diphenyl ether disulphonate and modified linear alkyl polyethoxylate in an amount of from 0.1 to 1% and preferably from 0.2 to 0.5% by volume. The modified linear alkyl polyethoxylate is available from Rhom and Haas Company under the trade name Triton DF12.

If desired sodium hexametaphosphate may be added to the aqueous solution in an amount of from 1 to 3% by weight in order to improve the hydrophilic character of the substrate after baking. Sodium hexametaphosphate is available from Albright and Wilson under the trade name Calgon ®.

The method can be used for any radiation-sensitive member which can be baked irrespective of whether or not the member includes components which give rise to contamination. In this regard, it is known that the source of the contamination can be present on the internal surfaces of the burning-in oven and thus contamination can be deposited on the nonimage areas even when the radiation-sensitive coating does not itself produce the contamination. However, the method is particularly useful in the case of members having a radiation-sensitive coating based on a mixture of a quinone diazide and a novolak resin since such members are particularly prone to the contamination problem.

The following Examples illustrate the invention.

EXAMPLE 1

An aluminium sheet which had been electrolytically grained in hydrochloric acid and anodised in sulphuric acid was whirler coated with a solution of 1 part by weight (pbw) of bis 1,2-naphthoquinone diazide-5-sulphonic acid ester of 2,3-dihydroxybenzophenone, 2 pbw of a cresol novolak resin, and
20 pbw of ethyl methyl ketone The resulting pre-sensitised plate was dried and then image-wise exposed and developed in conventional manner.

The plate was then wiped over with an aqueous solution containing

Sodium 2-ethyl hexyl sulphate 10% (by vol of a 40% (w/v) aqueous solution),
Tripotassium citrate 5% (w/v), and
Modified linear alkyl polyethoxylate 0.2% (by vol)

The plate was then baked for 10 minutes at 220° C., washed with water and inked-in. The non-image areas showed no sign of scumming.

Ethyl hexyl sulphate is available from Rewo Chemicals Ltd. under the trade name Rewopol NEHS40.

EXAMPLE 2

The aqueous solution of Example 1 was applied by hand to a Super Amazon plate and a Triton plate (both products of Howson Algraphy). The Super Amazon and Triton plates include a positive working radiation sensitive composition based on a diazo ester and a novolak resin. The plates were baked for 10 minutes at 220° C., washed with water and inked in. The non-image areas showed no sign of scumming and the image areas accepted ink readily.

EXAMPLE 3

Example 1 was repeated using a phosphoric acid anodised Spartan plate (Howson Algraphy), which is based on a positive working diazo ester/novolak composition. The background areas showed a considerable degree of scumming. A further Spartan plate was treated with the same solution except that it also contained 1% (w/v) citric acid. After baking and inking, the non-image areas were completely clean with no sign of scumming.

EXAMPLE 4

The following aqueous solution was applied by hand to Super Amazon, Triton and Super Spartan (Howson Algraphy) plates:

Sodium 2-ethyl hexyl sulphate 10% (by volume of a 40% (w/v) aqueous solution)

| Tripotassium citrate | 5% (w/v) |
|---|---|
| Dodecyl diphenyl ether disulphonate | 0.5% (v/v) |
| Citric acid | 1% (w/v) |

Each plate was baked for 10 minutes at 220° C., washed with water and inked. The non-image areas showed no sign of scumming and the image areas accepted ink readily.

EXAMPLE 5

Example 4 was repeated using AQ3 and RD11B plates (both products of Howson Algraphy). The AQ3 plate includes a radiation sensitive composition based on a diazo resin and binder. The RD11B plate includes a radiation sensitive composition, based on a photopolymerisable oligomeric acrylate, a photoinitiator and a binder, which is overcoated with a water soluble oxygen barrier layer. The non image areas showed no sign of scumming and the image areas accepted ink readily.

EXAMPLE 6

Example 4 was repeated with the exception that the aqueous solution was applied by means of an automatic processor. The plates were placed on an Heidelberg SORM printing press. All plates were noted to roll up quickly and all showed no signs of scumming.

EXAMPLE 7

Example 6 was repeated using the Plates of Example 5. Both types of plate were noted to roll up quickly and all showed no signs of scumming.

EXAMPLE 8

Example 4 was repeated using commercially available positive working plates viz New Capricorn (Horsell) including a radiation sensitive composition based on a novolak ester, P61 (Hoechst) including a radiation sensitive composition based on a diazo ester and novolak resin, and FPD (Fuji) based on quinone diazide esterified phenolic polymer. These plates accepted ink readily and all showed no sign of scumming.

EXAMPLE 9

A 10% solution (by vol. of a 40% (w/v) aqueous solution) of ethyl hexyl sulphate and a similar strength solution of the sodium salt of dodecyl diphenyl ether disulphonate were subjected to a foaming test by being placed in a measuring cylinder and inverted twenty times.

A comparison showed that the ethyl hexyl sulphate produced 40% less foam than the diphenyl ether sulphonate.

EXAMPLE 10

Example 1 was repeated except that the ethyl hexyl sulphate was replaced by the sodium salt of dodecyl diphenyl ether disulphonate.

Whilst the non-image areas were equally clean it was found that the image was more reluctant to take ink than when ethyl hexyl sulphate was used.

It was also noticed that the plate treated with ethyl hexyl sulphate was less prone to finger marking.

EXAMPLE 11

The following aqueous solution was applied by means of an automatic processor to Super Amazon, Triton and Super Spartan plates.

| Sodium 2-ethyl hexyl sulphate | 10% (by vol. of a 40% (w/v) solution) |
|---|---|
| Tripotassium citrate | 5% (w/v) |
| Dodecyl diphenyl ether disulphonate | 0.5% (v/v) |
| Citric acid | 1% (w/v) |
| Sodium hexametaphosphate | 2% (w/v) |

The plates were then baked at 220° C. for 10 minutes, washed with water and inked. The non-image areas showed no sign of scumming an the image areas accepted ink readily.

EXAMPLE 12 to 15

The aqueous solutions indicated in the table below ere applied to Super Amazon, Super Spartan and AQ3 plates. The plates were then baked at 220° C. for 10 minutes, washed with water and inked.

|  |  | Example | | | |
|---|---|---|---|---|---|
|  |  | 12 | 13 | 14 | 15 |
| Ethyl hexyl sulphate (40% (w/v) aqueous solution) | % (v/v) | 20 | 10 | 10 | 10 |
| Tripotassium citrate | % (w/v) | 5 | 10 | 5 | 5 |
| Dodecyl diphenyl ether disulphonate | % (v/v) | 0.5 | 0.5 | 1 | 0.5 |
| Citric acid | % (w/v) | 2 | 2 | 2 | 4 |

In all cases the plates showed no signs of scumming and the image areas accepted ink readily.

We claim:

1. A process for treating a radiation sensitive member which comprises image-wise exposure to radiation, development and a burning-in treatment wherein after the development and prior to the burning-in treatment an aqueous solution comprising ethyl hexylsulfate anions is applied to the member.

2. A process as claimed in claim 1 wherein the amount of ethyl hexyl sulphate anion in the aqueous solution is from 5 to 50% by volume of a 40% w/v aqueous solution.

3. A process as claimed in claim 1 wherein the amount of ethyl hexyl sulphate anion in the aqueous solution is from 8 to 15% by volume of a 40% w/v aqueous solution.

4. A process as claimed in claim 1 wherein the aqueous solution contains a citrate in an amount of from 3 to 10% by weight.

5. A process as claimed in claim 4 wherein the aqueous solution contains a citrate in an amount of 5 to 8% by weight.

6. A process as claimed in claim 4 wherein the citrate is tripotassium citrate.

7. A process as claimed in claim 1 wherein the pH of the aqueous solution is from pH3 to pH7.

8. A process as claimed in claim 7 wherein the pH of the solution is from pH4.5 to pH5.5.

9. A process as claimed in claim 1 wherein the aqueous solution contains citric acid in an amount of from 1 to 3% by weight.

10. A process as claimed in claim 1 wherein the aqueous solution further contains a surfactant in an amount of from 0.1 to 1% by volume.

11. A process as claimed in claim 10 wherein the aqueous solution further contains a surfactant in an amount of from 0.2 to 0.5% by volume.

12. An process as claimed in claim 11 wherein the aqueous surfactant is dodecyl diphenyl ether disulphonate.

13. A process as claimed in claim 10 wherein the aqueous surfactant is a modified linear alkyl polyethoxylate.

14. A process as claimed in claim 10 wherein the aqueous surfactant is dodecyl diphenyl ether disulphonate.

15. A process as claimed in claim 1 wherein the aqueous solution contains sodium hexametaphosphate in an amount of from 1 to 3% by weight.

* * * * *